United States Patent
Inaba et al.

(10) Patent No.: US 6,593,611 B1
(45) Date of Patent: Jul. 15, 2003

(54) SEMICONDUCTOR DEVICE AND MANUFACTURING METHOD THEREOF

(75) Inventors: Yutaka Inaba, Tokyo (JP); Junichi Tsuchimoto, Tokyo (JP); Kiyoshi Mori, Tokyo (JP); Tamotu Ogata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/478,810

(22) Filed: Jan. 7, 2000

(30) Foreign Application Priority Data

Jun. 30, 1999 (JP) ............................ 11-184883

(51) Int. Cl.⁷ ...................... H01L 27/108; H01L 29/76; H01L 21/20
(52) U.S. Cl. ...................... 257/301; 438/392
(58) Field of Search ............................ 257/301, 303, 257/306, 506, 532, 300, 310; 438/241, 243, 253, 396, 398, 255, 525, 532, 535, 387, 389, 390

(56) References Cited

U.S. PATENT DOCUMENTS

| 5,217,918 A | * | 6/1993 | Kim et al. ................... 437/52 |
| 5,792,686 A | * | 8/1998 | Chen et al. .................. 438/244 |
| 6,046,083 A | * | 4/2000 | Lin et al. ..................... 438/255 |
| 6,218,297 B1 | * | 4/2001 | Marsh ......................... 438/654 |
| 6,281,142 B1 | * | 8/2001 | Basceri et al. .............. 438/771 |
| 6,337,237 B1 | * | 1/2002 | Basceri et al. .............. 438/239 |

FOREIGN PATENT DOCUMENTS

| JP | 7-268663 | 10/1995 |
| JP | 10-22467 | 1/1998 |

* cited by examiner

Primary Examiner—Matthew Smith
Assistant Examiner—Calvin Lee
(74) Attorney, Agent, or Firm—McDermott, Will & Emery

(57) ABSTRACT

Improvements are realized in the coverage characteristics of a cell plate electrode with respect to a cylindrical storage node electrode which has a high aspect ratio (height/diameter) and a surface having minute irregularities formed thereon, thereby improving the electrical characteristics and reliability of a semiconductor device. The semiconductor device is manufactured through a step of forming a first cell plate electrode film on a cylindrical storage node electrode, a process of implanting conductive impurities into the first cell plate electrode film, and a process of forming a second cell plate electrode film on the first cell plate electrode film.

19 Claims, 11 Drawing Sheets

PRIOR ART

PRIOR ART

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device having semiconductor memory provided with a capacitor, as well as a method of manufacturing the semiconductor device.

2. Description of the Background Art

In recent years, in association with an increase in the degree of integration of a semiconductor integrated circuit, miniaturization of a semiconductor element has been pursued and realized rapidly. Particularly, miniaturization of a capacitor formed in DRAM (Dynamic Random Access Memory), which is one type of semiconductor memory device requiring a high degree of integration, directly results in a decrease in the storage capacity of the DRAM. Thus, miniaturization of the capacitor inevitably involves determining the way in which the desired capacity of the capacitor is to be ensured.

In an effort to solve such a problem, an attempt has been made to form a capacitor into a three-dimensional structure. Specifically, an electrode is formed into a three-dimensional structure in order to enlarge the surface area of electrodes of a capacitor; for example, three-dimensional capacitors that have been developed include a thick-film-type capacitor whose electrodes are thick, a fin-type capacitor comprising a stack of fin-shaped electrodes, and a cylindrical capacitor whose electrodes are formed cylindrically.

Aside from these three-dimensional capacitors, there is also proposed in; e.g., Applied Physics Vol. 61, No. 11, pg. 1147 (1992), a method of increasing the surface area of electrodes by forming minute irregularities on the surface thereof.

FIG. 20 is a cross-sectional view showing a conventional semiconductor memory device whose storage node electrodes are cylindrical and in which minute irregularities are formed in the surface of the electrode.

The structure of the semiconductor memory device will now be described.

Referring with FIG. 20, an element isolation oxide film 102 for isolating an element region is formed on the primary surface of a silicon substrate 101. On the element region isolated by the element isolation oxide film 102 is formed gate electrodes 103a and 103b by way of a gate oxide film (not shown) of the silicon substrate 101. N-type impurity diffusion layers 104a and 104b are formed so as to sandwich the gate electrode 103a for acting as source or drain region. The n-type impurity layers 104a and 104b constitute a transistor element 150 together with the gate electrode 103a.

On the silicon substrate 101 and the transistor element 150 is formed a insulating film 105 which has an opening 106 extending to the surface of the n-type impurity diffusion layer 104b. The inside of the opening 106 is filled with polysilicon, thus constituting a plug layer 107. An interlayer insulating film 108 is formed on the plug layer 107 and the insulating film 105 so as to have a cylindrical opening 109 extending to the surface of the plug layer 107. A capacitor 200 is fabricated to cover the inside of the cylindrical opening 109 and the certain region of the interlayer insulating film 108.

The capacitor 200 has minute irregularities 111 on the surface thereof, and comprises a cylindrical storage node 110 formed within the cylindrical opening 109 and is electrically connected to the plug layer 107; a capacitor insulating film 112 formed on the surface of the cylindrical storage node electrode 110, as well as on the surface of the interlayer insulating film 108; and a cell plate electrode 113 formed on the capacitor insulating film 112 as an upper electrode.

A method of forming the semiconductor memory device shown in FIG. 20 will now be described.

First, the element isolation oxide film 102, the transistor element 150, the insulating film 105, and the plug layer 107 filling the opening 106 are formed in accordance with known manufacturing methods.

Then, the interlayer insulating film 108 is formed on the plug layer 107 and the insulating film 105. The cylindrical opening 109 is selectively opened through use of photolithography so as to communicate with the opening 106.

Next, the cylindrical storage node electrode 110 has been formed within the cylindrical opening 109 from an amorphous silicon film doped with n-type impurities. The surface of the cylindrical storage node 110 is subjected to heat treatment, thus forming the minute irregularities 111.

A nitride-oxide film and a polysilicon film doped with an n-type impurity are sequentially deposited on the cylindrical storage node electrode 110. On the polysilicon film is formed a resist pattern so as to have a desired pattern. The polysilicon film and the nitride-oxide film are etched in sequence while the resist pattern is used as a mask, thus forming the capacitor insulating film 112 and the cell plate electrode 113. Since the thickness of the surface of the capacitor insulating film 112 is usually very thin, the irregularities 111 formed on the surface of the storage node electrode 110 are reflected on the surface of the film 112, exactly as they are.

The cell plate electrode 113 is formed by the low-pressure CVD technique of tube type while using raw material gas containing n-type impurities such as phosphorous.

Finally, desired heat treatment is performed for activation the n-type impurities contained in the cylindrical storage node electrode 110 and the cell plate electrode 113.

In the semiconductor memory device manufactured in the manner as mentioned above, the storage node electrode 110 is formed into a cylindrical shape, and the minute irregularities 111 are formed on the surface of the storage node electrode 110. Accordingly, desired capacitance can be ensured without involvement of an increase in the planar area occupied by the capacitor 200.

However, the conventional semiconductor memory device has problems that would described below.

FIG. 21 is an enlarged and exaggerated cross-sectional view showing the adhesion state between the irregular surface of the capacitor insulating film 112 formed on the cylindrical storage node electrode 110 and the surface of the cell plate electrode 113 formed on the capacitor insulating film 112.

As shown in FIG. 21, the conventional cell plate electrode 113 cannot sufficiently reflect the irregularities 111a and 111b formed on the surface of the capacitor insulating film 112. Consequently, the effect of increasing the surface area by virtue of irregularities cannot be sufficiently reflected in the semiconductor memory device, thus resulting in a failure to ensure desired capacity.

Further, if the aspect ratio (height/diameter) of the cylindrical section of the cylindrical storage node electrode 110 becomes greater in association with an increase in the degree of miniaturization of the semiconductor device in question, the coverage becomes degraded with regard to the cylindrical storage node electrode 110. Thus, as shown in FIG. 20, the interior walls of the cell plate electrode 113 come into contact with each other at the top portions thereof, to thereby constitute a cavity 114 and impair the electrical characteristics or reliability of the semiconductor device.

SUMMARY OF THE INVENTION

The present invention has been conceived to solve the foregoing problems in the background art.

A first object of the present invention is to provide a method of manufacturing a semiconductor device, wherein a cell plate electrode is formed so as to reliably cover minute irregularities formed on the surface of a cylindrical storage node electrode.

A second object of the present invention is to provide a method of manufacturing a semiconductor device, wherein a cell plate is formed so as to reliably cover a cylindrical storage node electrode having a high aspect ratio.

A third object of the present invention is to provide a method of manufacturing a semiconductor device, wherein a cell plate electrode film is uniformly doped with conductive impurities.

A fourth object of the present invention is to provide a semiconductor device having a capacitor which is provided with desired capacitance, desirable electrical characteristics, and reliability.

The above objects of the present invention are achieved by a method of manufacturing a semiconductor device described below. According to the method, a semiconductor element is formed so as to have an impurity diffusion layer on the primary surface of a semiconductor substrate. A cylindrical storage node electrode is formed so as to electrically connect to the impurity diffusion layer by way of a insulating film formed on the semiconductor element and the semiconductor substrate. A capacitor insulating film is formed on the cylindrical storage node electrode. A first cell plate electrode film is formed on the capacitor insulating film. Conductive impurities are implanted into the first cell plate electrode film. A second cell plate electrode film is formed on the first cell plate electrode film.

The above objects of the present invention are also achieved by a semiconductor device described below. The semiconductor device includes a semiconductor element having an impurity diffusion layer formed on the primary surface of a semiconductor substrate. A cylindrical storage node electrode is provided so as to electrically connect to the impurity diffusion layer by way of a insulating film formed on the semiconductor substrate including the semiconductor element. A capacitance insulating film is provided on the cylindrical storage node electrode. A first cell plate electrode is provided on the capacitance insulating film. Further, a second cell plate electrode is provided on the first cell plate electrode.

Other objects and further features of the present invention will be apparent from the following detailed description when read in conjunction with the accompanying drawings.

DESCRIPTION OF THE PREFERRED EMBODIMENTS

In the following, principles and embodiments of the present invention will be described with reference to the accompanying drawings.

First Embodiment

Figure 1:
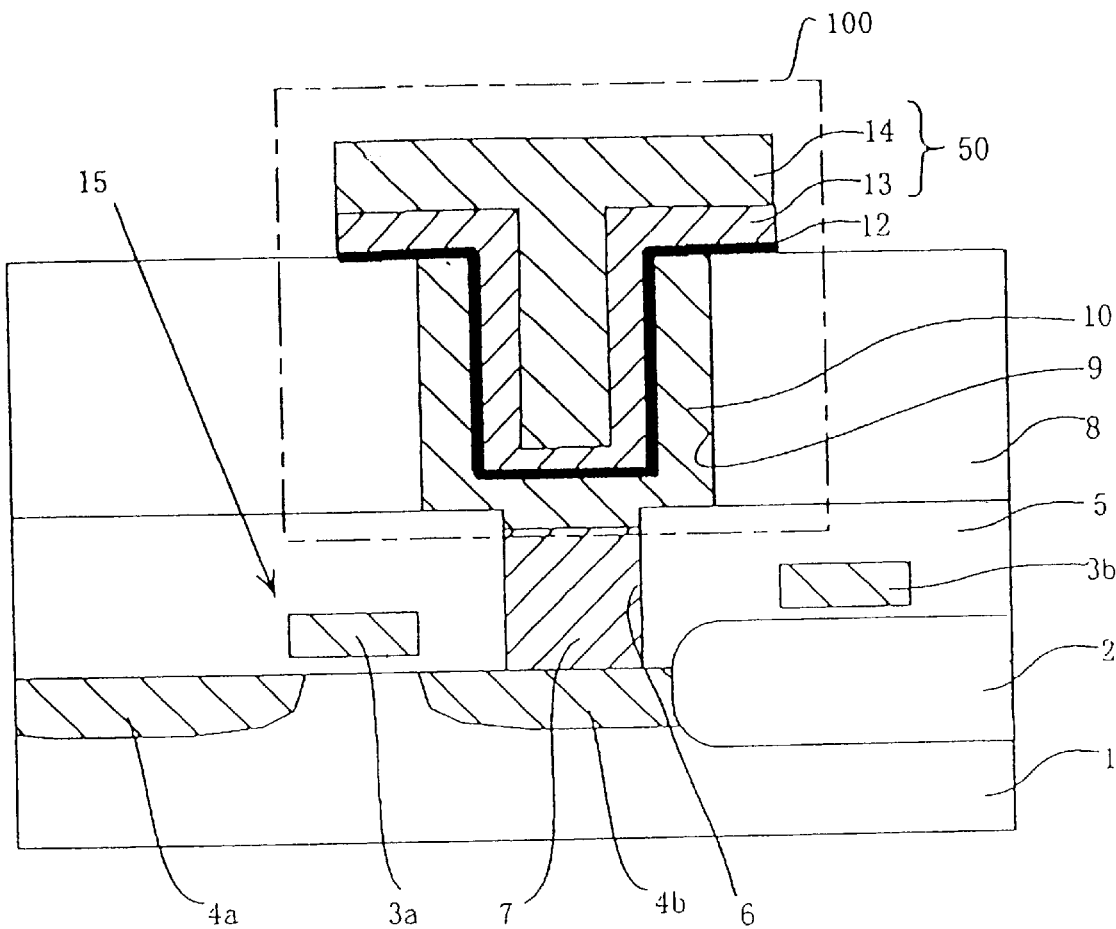
FIG. 1 is a cross-sectional view showing a semiconductor memory device according to a first embodiment of the present invention.

FIG. 1 is a cross-sectional view showing a semiconductor memory device having a cylindrical capacitor according to a first embodiment of the present invention. The structure of the semiconductor memory device will now be described.

Referring with FIG. 1, on the primary surface of a silicon substrate 1 formed from p-type silicon is formed an element isolation oxide film 2 for isolating an element region. On the element region isolated by the element isolation oxide film 2 is formed gate electrodes 3a and 3b by way of a gate oxide film (not shown) of the silicon substrate 101. N-type impurity diffusion layers 4a and 4b are formed so as to sandwich the gate electrode 3a for acting as source or drain region. The n-type impurity layers 4a and 4b constitute a transistor element 15 together with the gate electrode 3a.

On the silicon substrate 1 and the transistor element 15 is formed a insulating film 5 which has an opening 6 extending to the surface of the n-type impurity diffusion layer 4b. The inside of the opening 6 is filled with polysilicon, thus constituting a plug layer 7. An interlayer insulating film 8 is formed on the plug layer 7 and the insulating film 5 so as to have a cylindrical opening 9 extending to the surface of the plug layer 7. A capacitor 100 is fabricated to cover the inside of the cylindrical opening 9 and the certain region of the interlayer insulating film 8.

As explained thus far, the semiconductor memory device is identical in structure with that described in connection with the conventional example.

The capacitor 100 comprises a cylindrical storage node electrode 10 which is formed as a lower electrode in the cylindrical opening 9 so as to electrically connect to the n-type impurity diffusion layer 4b by way of the plug layer 7; a capacitor insulating film 12 which is formed so as to cover certain region of the interlayer insulating film 8 and the surface of the cylindrical storage node electrode 10; a first cell plate electrode 13 formed on the capacitor insulating film 12; and a second cell plate electrode 14 formed on the first cell plate electrode 13.

The first cell plate electrode 13 and the second cell plate electrode 14 constitute a cell plate electrode 50 which serves as an upper electrode.

A method of manufacturing the semiconductor device shown in FIG. 1 will now be described.

Figure 2:
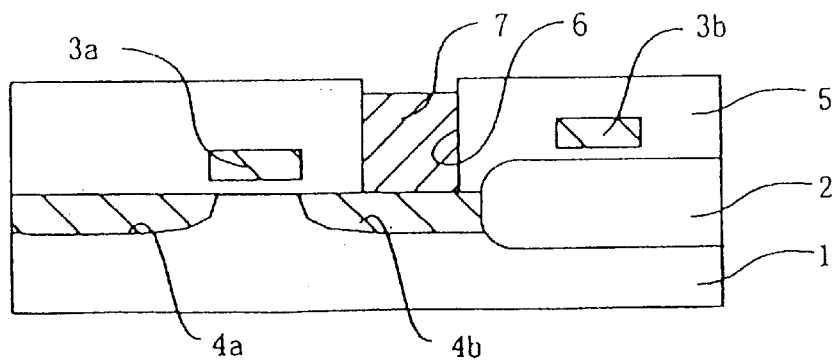
FIGS. 2 through 12 are cross-sectional views for describing a manufacturing method of the semiconductor memory device according to the first embodiment of the present invention.

Referring with FIG. 2 at first, the element isolation oxide film 2, the transistor element 15, and the plug layer 7, which fills the opening 6 of the insulating film 5, are formed through use of known manufacturing methods.

The plug layer 7 may be formed from polysilicon or tungsten.

Figure 3:
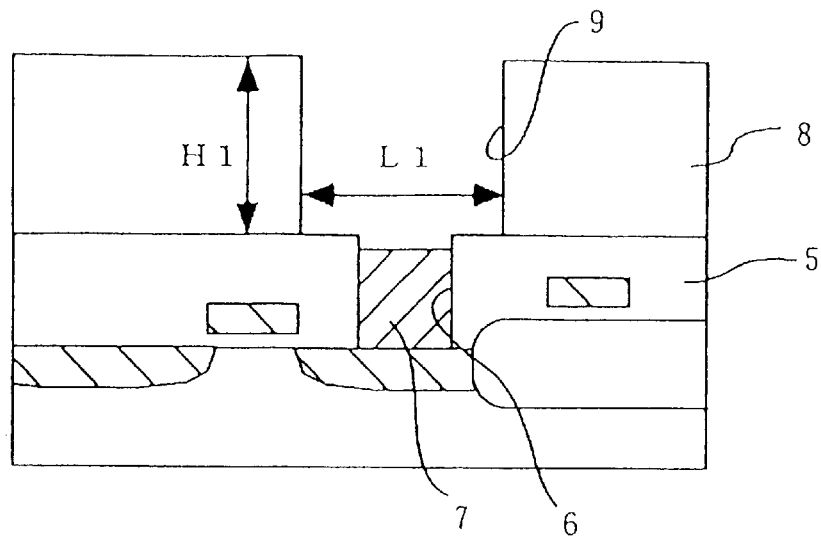

The referring to FIG. 3, an oxide film is deposited with a thickness of 2 m on the plug layer 7 and the insulating film 5 by means of CVD, in order to form an interlayer insulating film 8. The interlayer insulating film 8 is selectively opened by means of photolithography so as to form the cylindrical opening 9 communicating with the opening 6.

The cylindrical opening 9 has an opening diameter of 0.4 $\mu$m. In the first embodiment, the opening diameter corresponds to the diameter of the cylindrical opening if the cylindrical opening is in a circular shape, while corresponding to the minor diameter if the cylindrical opening is in an oval shape. Specifically, the aspect ratio (H1/L1) of the cylindrical opening 9 is about five.

Figure 4:
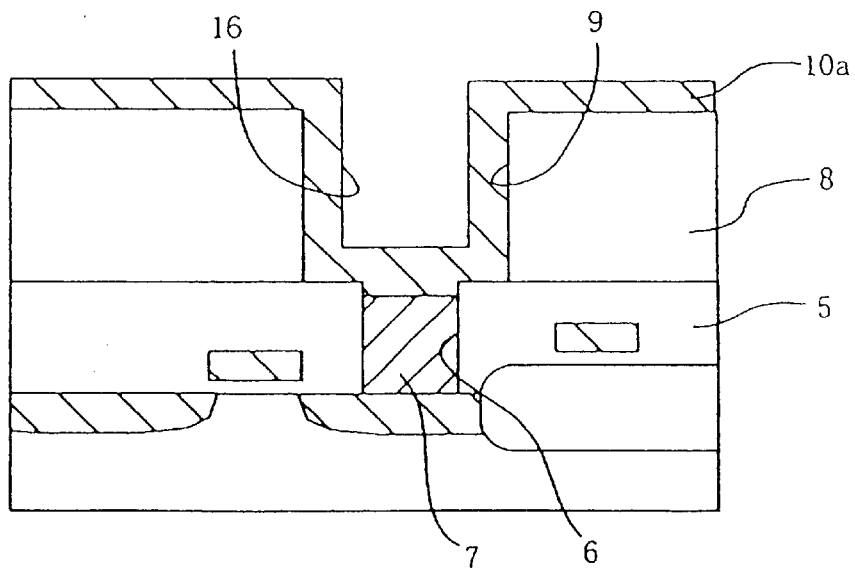

Referring with FIG. 4, a silicon film 10a doped with n-type impurities such as phosphorous is formed to a thickness of 50 nm in the cylindrical opening 9 and on the interlayer insulating film 8.

The silicon film 10a is formed at a film-growth temperature of 515 to 535° C. and a pressure of 0.45 Torr through use of a tube-type low-pressure CVD system, in order to improve the coverage thereof to the inside of the cylindrical opening 9.

Within the cylindrical opening 9, the silicon film 10a conforms to the configuration of the cylindrical opening 9, whereby another cylindrical opening 16 is eventually formed.

In order to prevent depletion which would be caused when the silicon film 10a is used as an electrode, the n-type impurities must be implanted into the silicon film 10a at a concentration of at least $2 \times 10^{20}$ atom/cm$^3$.

Figure 5:
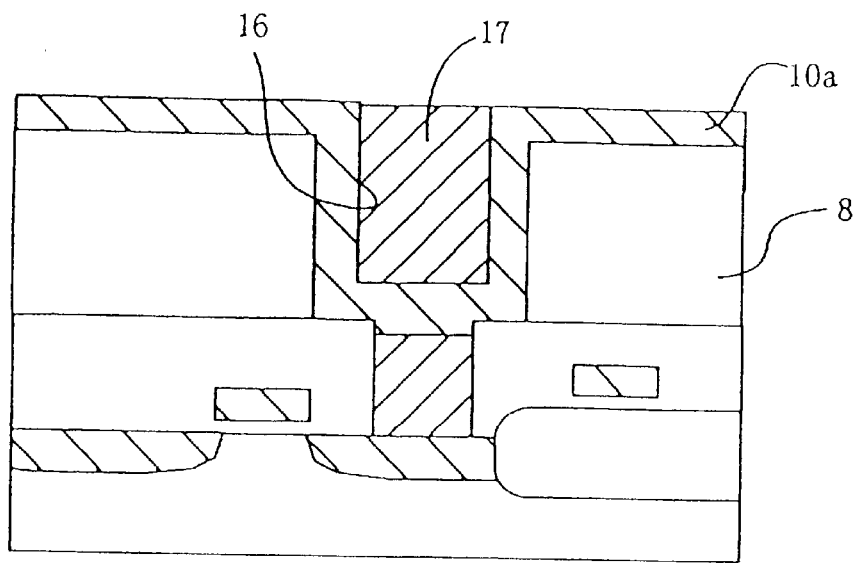

Referring with FIG. 5, a resist film is formed on the silicon film 10a so as to fill the cylindrical opening 16. The entire surface of the resist film is exposed to exposure light which is appropriately controlled. Then, the resist film is subjected to development process, whereby a resist film 17 is formed so as to fill the inside of the cylindrical opening 16.

Figure 6:
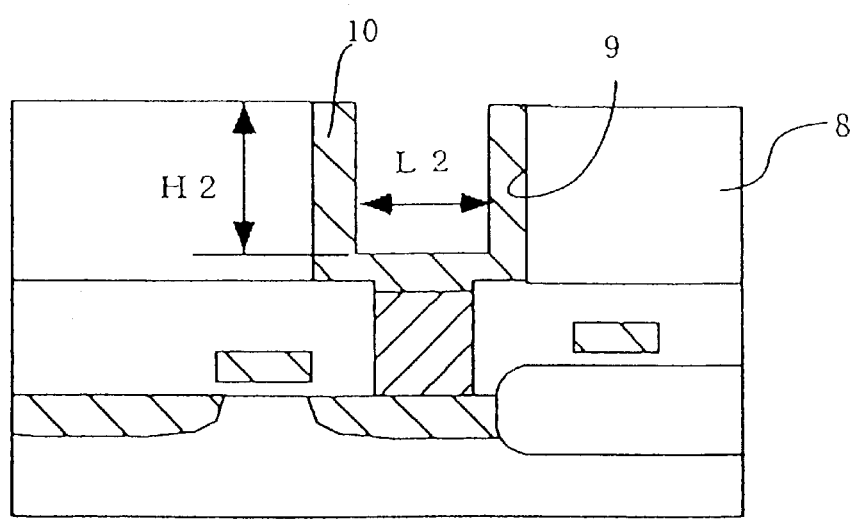

Referring with FIG. 6, the silicon film 10a formed on the interlayer insulating film 8 is etched back through dry etching while the resist film 17 is used as a mask. Subsequently, the resist film 17 is removed to thereby form the cylindrical storage node electrode 10, which serves as a lower electrode of the capacitor.

At this time, the aspect ratio (H2/L2) of the cylindrical opening 16 becomes about six. That is, because of the thickness of the silicon film 10a, the aspect ratio of the cylindrical opening 16 becomes more critical than that of the cylindrical opening 9 for ensuring enough coverage.

Figure 7:
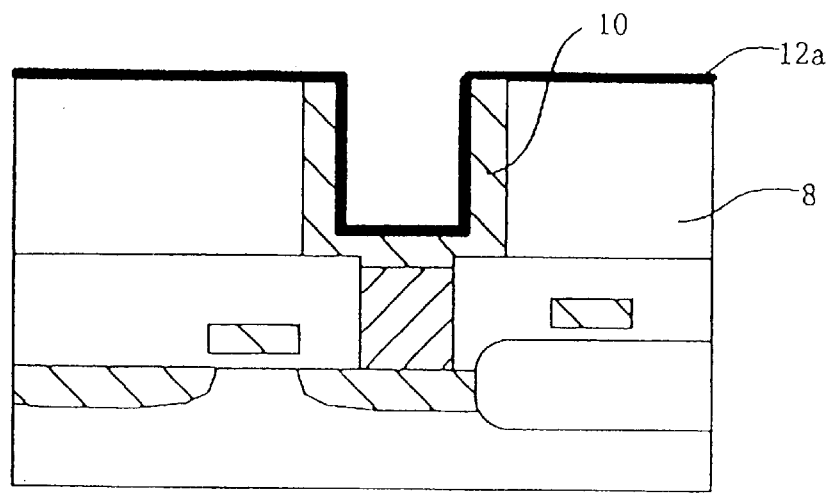

Referring with FIG. 7, a thin insulating film 12a, which is to act as a capacitor insulating film, is formed to a thickness of about 6 nm on the surface of the cylindrical storage node 10 and the interlayer insulating film 8. The insulating film 12a is a nitride-oxide film, which is formed by illustratively oxidation in a vapor environment, of the surface of a silicon nitride film formed through use of a low-pressure CVD system.

Figure 8:
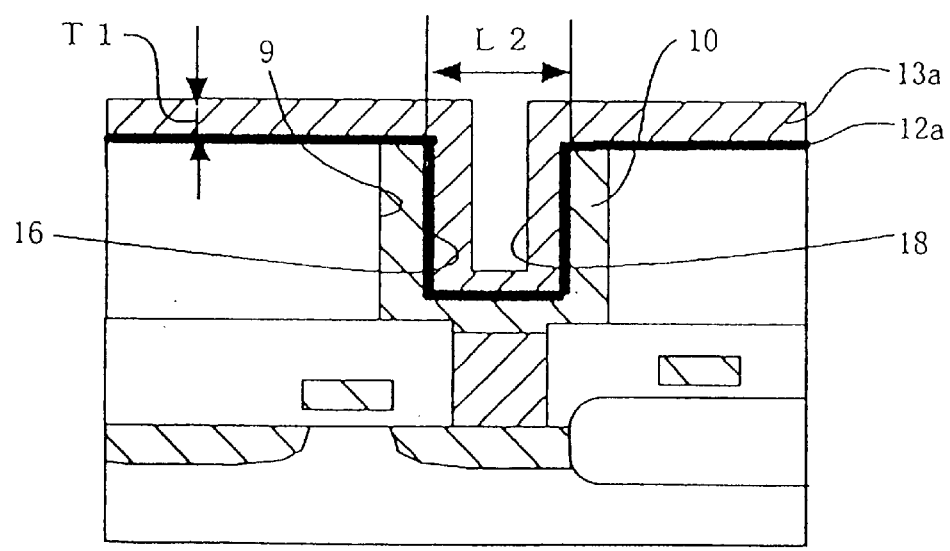

Next, referring with FIG. 8, a silicon film 13a, which is to act as a first cell plate electrode, is formed on the insulating film 12a to a thickness of about 100 nm.

The silicon film 13a is formed by means of the tube-type low-pressure CVD method using raw-material gas which does not contain any n-type impurities such as phosphorous.

The silicon film 13a is formed so as not to include any n-type impurities by the method described above. And this step is differed from the conventional silicon film formed so as to contain n-type impurities. The silicon film 13a covers under layer step differences with a superior coverage as compared with the conventional silicon film.

Consequently, so long as the thickness thereof is appropriately controlled, the silicon film 13a shows an improved coverage characteristic inside the cylindrical opening 16 of high aspect ratio. Thus, the opposite upper ends of the silicon film 13a are not brought into contact each other in this case, whereby the cavity which is formed by the prior art technique is prevented from arising. As a result, the upper ends of the silicon film 13a are sufficiently separated, and the silicon film 13a assumes a cylindrical geometry which reflects the geometry of the cylindrical opening 16, substantially as is. Consequently, still another new cylindrical opening 18 is eventually formed.

In order to improve the coverage characteristics of the silicon film 13a, the thickness T1 shown in FIG. 8 of the silicon film 13a is preferably set to equal to or less than half of the diameter L2 of the cylindrical opening 16 of the cylindrical storage node electrode 10.

Figure 9:
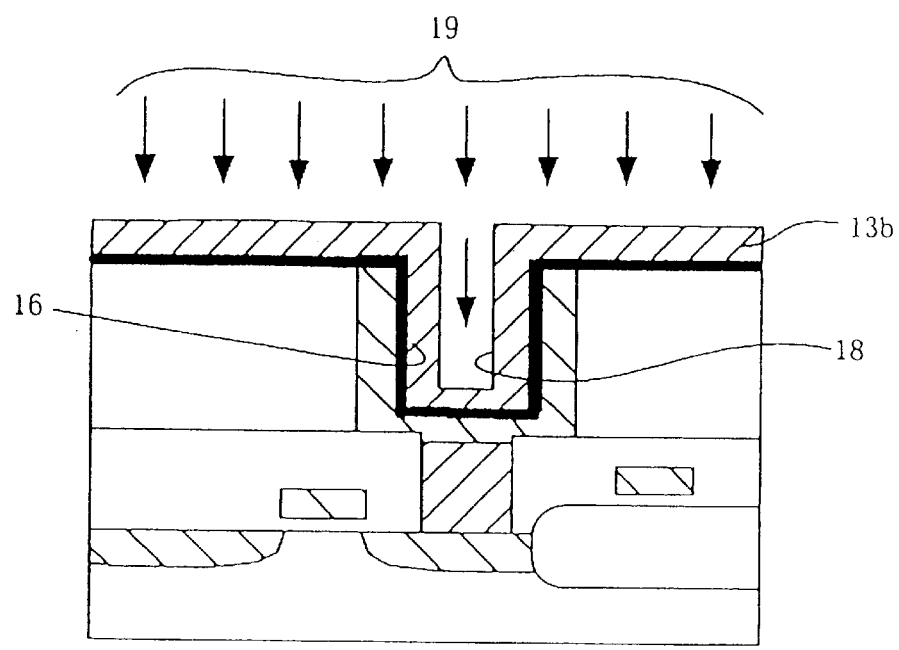

Referring with FIG. 9, at this step, n-type impurities are implanted into the silicon film 13a which does not contain any n-type impurities.

Through use of an ion implantation system, impurities; e.g., phosphorous ions 19, are implanted at a small angle of about 0 to 7° (from the vertical) and at a dose of $8 \times 10^{15}$ atom/cm$^2$.

By way of the cylindrical opening 18 formed by virtue of the superior coverage characteristics of the silicon film 13a, the ions 19 implanted can reach the bottom and side surfaces of the silicon film 13a, so that the ions 19 are implanted into the entire silicon film 13a at uniform concentration.

As an alternative to phosphorous ions, arsenic or antimony ions may be used as n-type impurities to be implanted.

After completion of the impurity implantation, a silicon film 13b is formed so as to contain n-type impurities with concentration of $2 \times 10^{20}$ atom/cm$^3$.

Figure 10:
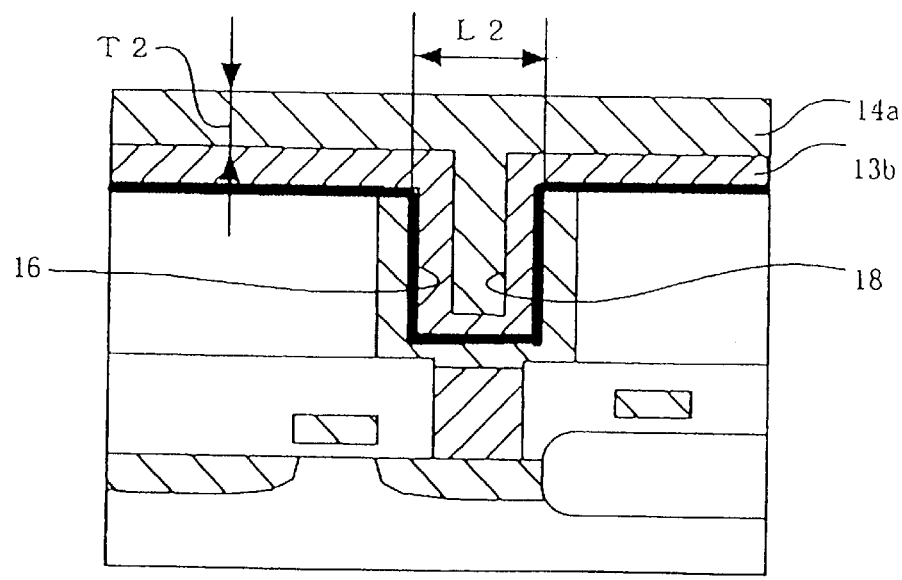

Referring with FIG. 10, by means of a low-pressure CVD method which uses raw-material gas containing n-type impurities such as phosphorous, a silicon film 14a, which serves as a second cell plate electrode, is formed on the silicon film 13b to a thickness of 200 nm so as to fill the cylindrical opening 18.

At this time, the impurities are implanted at a concentration of $4 \times 10^{20}$ atom/cm$^3$ to $8 \times 10^{20}$ atom/cm$^3$.

In order to completely fill the opening 18, the thickness T2 of the silicon film 14a is preferably set to equal to or more than half of the diameter L2 of the cylindrical opening 16 of the cylindrical storage node electrode 10.

Figure 11:
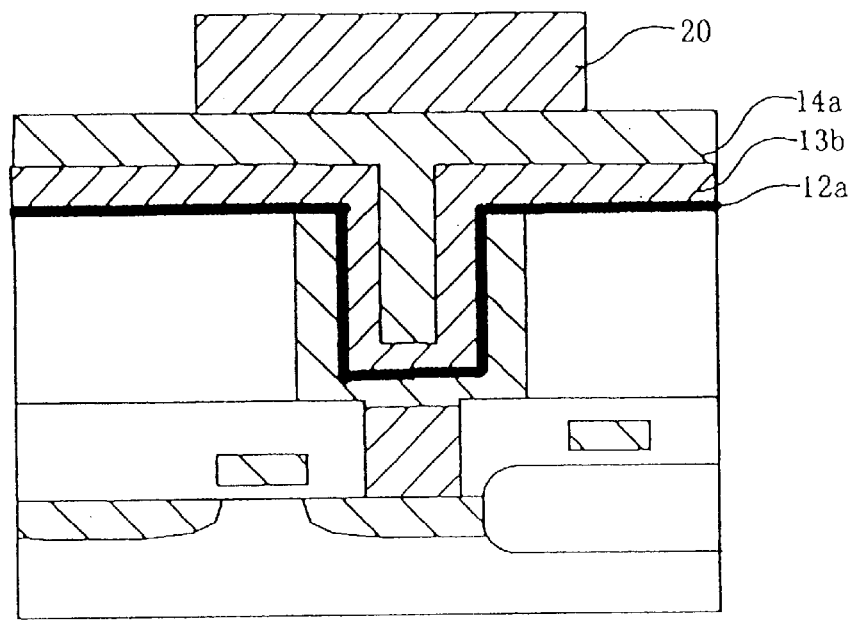

Referring with FIG. 11, by means of conventional photolithography a desired resist pattern 20 is formed on the silicon film 14a.

Figure 12:
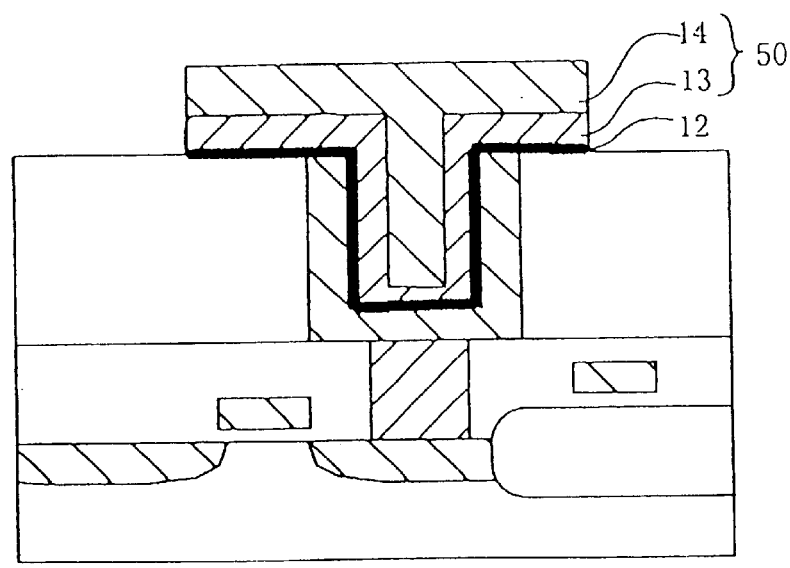

Next, referring with FIG. 12, the silicon film 14a, the silicon film 13b, and the insulating film 12a are etched in sequence while the resist pattern 20 is used as a mask, thereby constituting a cell plate electrode 50 comprising the capacitor insulating film 12, the first cell plate electrode 13, and the second cell plate electrode 14.

Finally, after removal of the resist pattern 20, the silicon substrate 1 is subjected to desired heat treatment for activating the n-type impurities included in the cylindrical storage node electrode 10 and the cell plate electrode 50.

As mentioned above, according to the first embodiment, the silicon film 13a, which acts as a first cell plate electrode film, is deposited by means of a method that does not employ any n-type impurities. Accordingly, the coverage of the cylindrical opening 16 of the cylindrical storage node electrode 10 by the silicon film 13a has improved characteristics, thereby enabling uniform implantation of n-type impurities over the entire surface of the silicon film 13a. Further, the silicon film 14a, which acts as a second cell plate electrode, can be ensured to assume a thickness sufficient to prevent depletion of the cell plate electrode, thereby improving the electrical characteristics and reliability of the device.

Second Embodiment

A second embodiment of the present invention will now be described.

Figure 13:
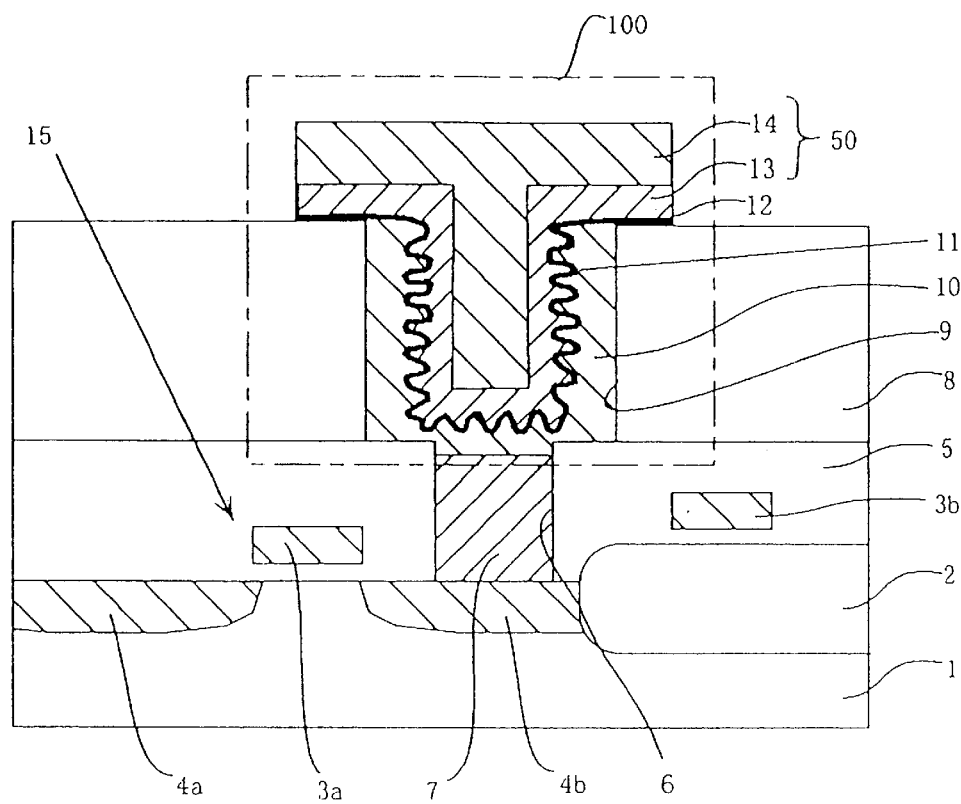
FIG. 13 is a cross-sectional view showing a semiconductor memory device according to a second embodiment of the present invention.

FIG. 13 is a cross-sectional view showing a semiconductor device manufactured according to the second embodiment.

As shown in FIG. 13, the semiconductor memory device practiced as the second embodiment differs from the semiconductor memory device according to the first embodiment shown in FIG. 1 in that minute irregularities 11 are formed on the surface of the cylindrical storage node electrode 10.

Hereinafter, the description of the structure of the semiconductor memory device is omitted, and only the method of manufacturing the same will be explained.

Reference numerals which are the same as those used in connection with the first embodiment designate identical or corresponding elements.

According to the manufacturing steps shown in FIGS. 2 through 6 regarding to the first embodiment, the semiconductor memory device is manufactured until having the cylindrical storage node electrode 10 shown in FIG. 6.

Figure 14:
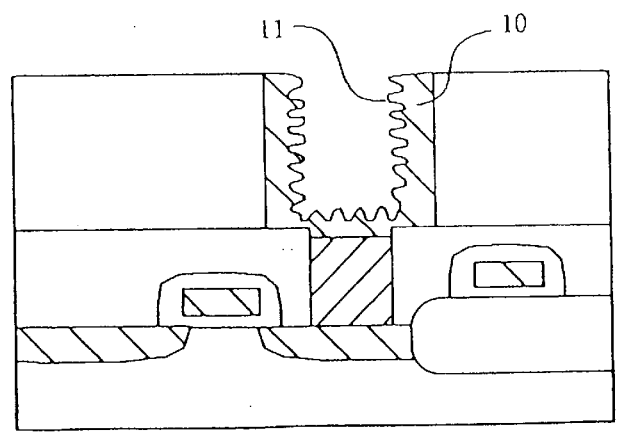
FIGS. 14 through 16 are cross-sectional views for describing a manufacturing method of the semiconductor memory device according to the second embodiment of the present invention.

Next, referring with FIG. 14, the cylindrical storage node electrode 10 is subjected to heat treatment at a temperature of 700° C. for five minutes for forming the minute irregularities 11 on the surface of the cylindrical storage node electrode 10. As a result, the surface area of the cylindrical storage node electrode 10 is increased substantially.

On the assumption that a single protuberance of the irregularities 11 is taken as a particle, mean particle size is controlled so as to range from 30 to 80 nm.

Figure 15:
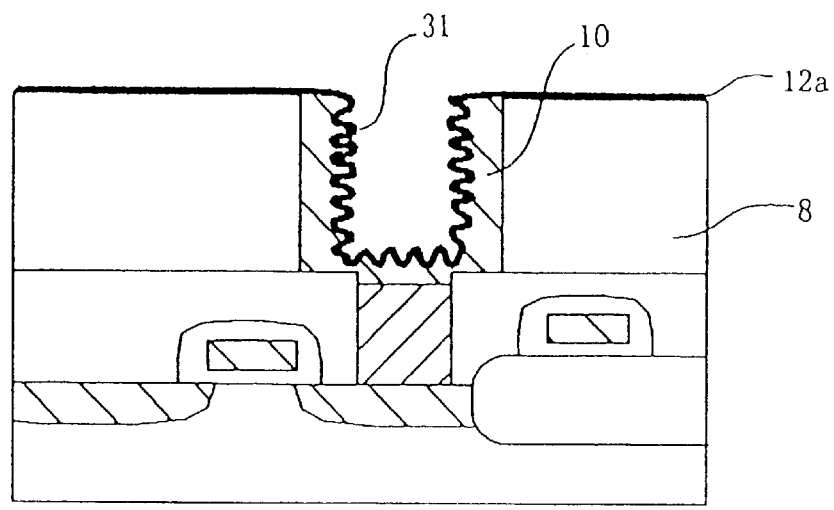

Referring with FIG. 15, the thin insulating film 12a, which is to act as a capacitor insulating film, is formed to a thickness of about 6 nm on the surface of the cylindrical storage node electrode 10 and the interlayer insulating film 8.

As in the case of the first embodiment, the insulating film 12a is a nitride-oxide film formed by oxidation, in a vapor environment, of the surface of a silicon nitride film formed through use of a low-pressure CVD system.

As shown in FIG. 15, the insulating film 12a is thin and formed so as to reliably cover with a superior coverage the irregularities 11 formed on the surface of the cylindrical storage node electrode 10.

Figure 16:
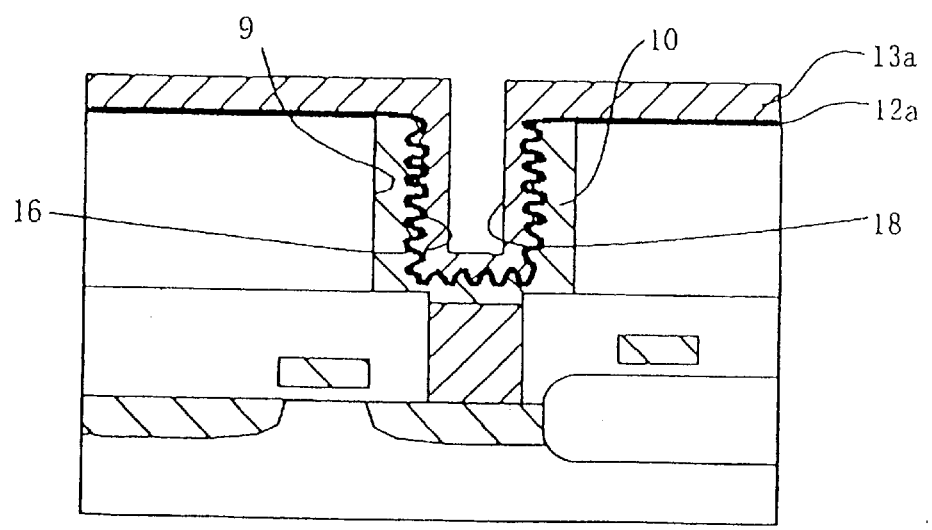

Referring with FIG. 16, the silicon film 13a, which is to act as a first cell plate electrode, is formed on the insulating film 12a to a thickness of about 100 nm.

As in the case of the first embodiment, by means of the tube-type low-pressure CVD method, the silicon film 13a is formed from raw-material gas which does not contain any n-type impurities such as phosphorous.

The silicon film 13a formed so as not to include any n-type impurities by the method described above covers an under layer minute irregularities 31 with a superior coverage as compared with the conventional silicon film formed so as to contain n-type impurities.

Further, as mentioned in connection with the first embodiment, the silicon film 13a also covers the cylindrical storage node electrode 10 with an improved coverage.

Finally, in accordance with manufacturing processes similar to those according to the first embodiment shown in FIGS. 9 through 12, the semiconductor memory device shown in FIG. 13 is completed.

As mentioned above, under the method of manufacturing the semiconductor memory device according to the second embodiment, the silicon film 13a, which is to act as a first cell plate electrode film, is deposited by means of a method that does not employ any n-type impurities. Consequently, the coverage characteristics of the silicon film 13 with respect to the minute irregularities 11 and 31 formed on the surface of the cylindrical storage node electrode 10 are improved. Further, by virtue of the silicon film 14a, which is to act as a second cell plate electrode, the cell plate electrode 50 can be ensured of having a sufficient thickness, thus preventing depletion of the cell plate electrodes. As a result, the method yields an improvement in the electrical characteristics and reliability of a device, as well as a desired capacitance.

Third Embodiment

A third embodiment of the present invention will now be described.

In the present embodiment, the semiconductor memory device is manufactured employing a forming method of a capacitor cell plate identical as that performed in the first embodiment except that the silicon film 13a which is to act as the first cell plate electrode film is subject to an exposure to a high-temperature gas environment containing n-type impurities for being doped with n-type impurities.

Consequently, since the semiconductor memory device according to the third embodiment is identical with that described in connection with the first embodiment in terms of overall structure, an explanation of the structure of the semiconductor memory device is omitted here, and only the characteristic processes of the manufacturing method according to the third embodiment will now be explained.

The third embodiment will be described primarily by reference to FIG. 17.

Figure 17:
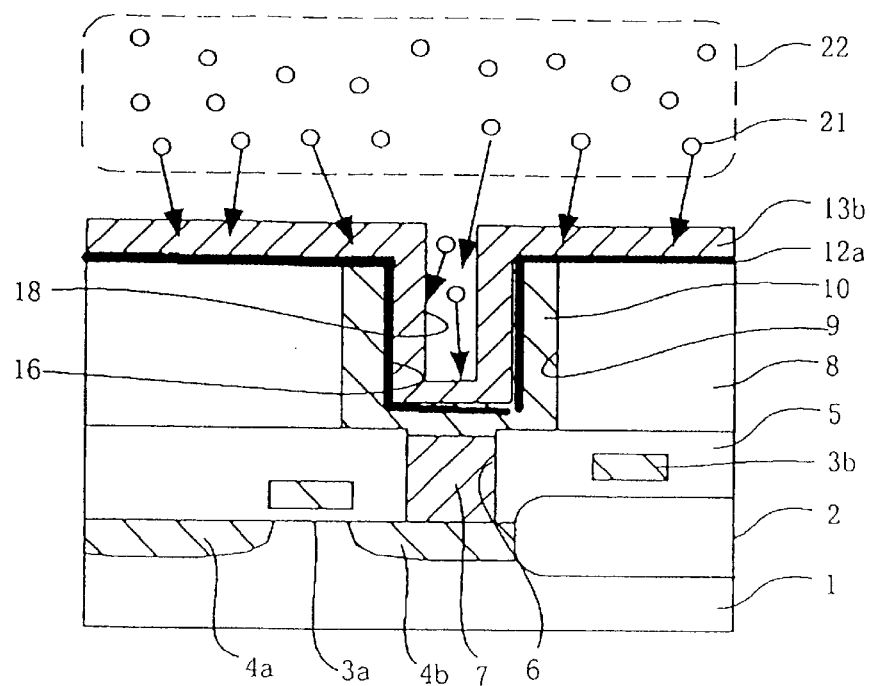
FIG. 17 is a cross-sectional view for describing a manufacturing method of a semiconductor memory device according to the third embodiment of the present invention.

In FIG. 17, those reference numerals that are the same as those used in FIG. 1 designate identical or corresponding elements.

Through manufacturing processes similar to those according to the first embodiment, which are shown in FIGS. 2 through 8, formation of the semiconductor memory device is carried out until the process in which the silicon film 13a, which acts as a first cell plate electrode film, is formed.

As described in conjunction with the first embodiment, the silicon film 13a is deposited by means of a method that does not employ any n-type impurities. Accordingly, in the case where the cylindrical storage node has a high aspect ratio, the silicon film 13a has improved coverage characteristics as compared with the conventional silicon film which is formed so as to contain n-type impurities.

Next, referring with FIG. 17, the silicon film 13a is exposed for 60 minutes to a gas environment 22 containing n-type impurities 21, such as phosphine (PH3), at a film growth temperature of 750° C. at a pressure of 50 Torr, whereby the n-type impurities 21 contained in the gas environment 22 are diffused into the silicon film 13a.

Such gaseous n-type impurities 21 migrate in random directions within the cylindrical opening 18, which is formed by virtue of superior coverage characteristics of the silicon film 13a, whereby the n-type impurities 21 are uniformly diffused into the bottom and side surfaces of the silicon film 13a within the cylindrical opening 16. Consequently, the n-type impurities can be implanted into the entire silicon film at uniform concentration.

Finally, the semiconductor memory device is completed through the manufacturing processes which are shown in FIGS. 10 through 12 and are similar to those according to the first embodiment.

In the third embodiment, no particular descriptions are given of a manufacturing system and the corresponding processing chambers for carrying out the process for forming the silicon film 13*a* that does not contain n-type impurities and the process for implanting n-type impurities into the silicon film 13*a*. However, the two processes may be performed within a single processing chamber of a single manufacturing system. In this case, formation of a film and implantation of n-type impurities may be effected in a single minor step. The silicon film 13*b* is formed through continuous and repetitive execution of the minor step. In contrast with a case where the two processes are effected within separate processing chambers, implantation of n-type impurities into the silicon film 13*b* can be carried out more efficiently with superior control.

As mentioned above, since in the third embodiment the silicon film 13*a*, which acts as a first cell plate electrode film, is deposited by means of a method that does not employ any n-type impurities, the silicon film 13*a* has improved coverage characteristics with respect to the cylindrical opening 16 of the cylindrical storage node electrode 10. Further, since n-type impurities are implanted into the silicon film 13*a* in an environment containing n-type impurities, the impurities can be implanted into the entire silicon film 13*a* at uniform concentration.

As a result, the electrical characteristics and reliability of a device are improved to a great extent.

Fourth Embodiment

A fourth embodiment of the present invention will now be described.

As in the case of the third embodiment, the present embodiment relates to a method of implanting n-type impurities into the silicon film 13*a*, which acts as the first cell plate electrode film. The present embodiment is characterized by implantation of n-type impurities into the silicon film 13*a* by means of diffusion of n-type impurities into the silicon film 13*a* from an impurity-containing layer 23, which is formed so as to contain n-type impurities on the silicon film 13*a*.

Consequently, as in the case of the third embodiment, an explanation about the structure of the semiconductor memory device is omitted, and only the characteristic process of the method of manufacturing a semiconductor memory device will be explained.

The fourth embodiment will now be described primarily by reference to FIGS. 18 and 19. In the drawings, those reference numerals that are the same as those used in the first embodiment designate identical or corresponding elements.

Through manufacturing processes similar to those according to the first embodiment shown in FIGS. 2 through 9, formation of the semiconductor memory device is carried out until the step shown in FIG. 9, where the silicon film 13*a*, which acts as a first cell plate electrode film, is formed.

As in the case of the first through third embodiments, the silicon film 13*a* is deposited by a method that does not employ any n-type impurities. Accordingly, in the case where the cylindrical storage node 10 has a high aspect ratio, the silicon film 13*a* has improved coverage characteristics with respect to the cylindrical storage node 10, as compared with the conventional silicon film which is formed so as to contain n-type impurities.

Figure 18:
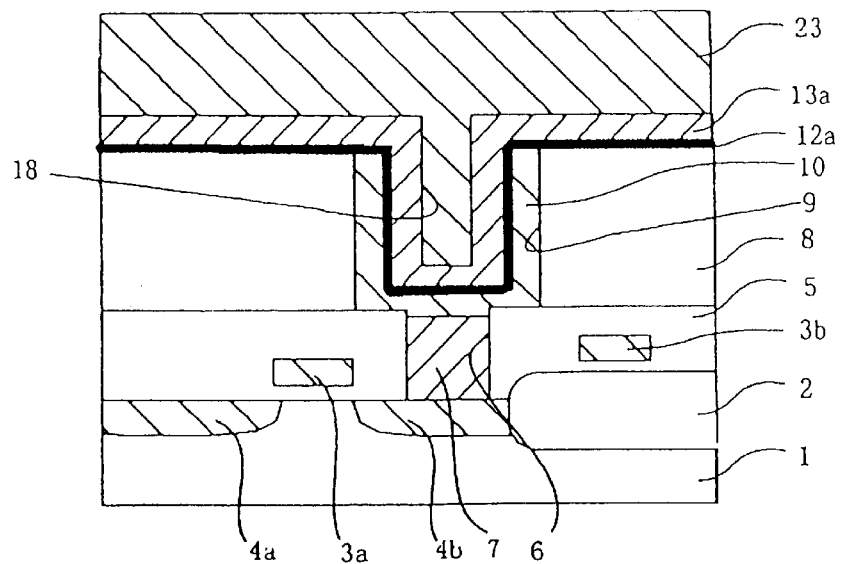
FIGS. 18 and 19 are cross-sectional views for describing a manufacturing method of a semiconductor memory device according to the fourth embodiment of the present invention.

As shown in FIG. 18, through use of the spin-coating technique, a solution in which n-type impurities such as phosphorous, arsenic, or antimony are dissolved is applied to a thickness on the order of hundreds to thousands of nanometers, over the surface of the silicon film 13*a* that does not contain n-type impurities.

By appropriate adjustment of the viscosity of the employed solution, the impurity-containing layer 23 is formed so as to fill the inside of the cylindrical opening 18, which is formed by virtue of the superior coverage characteristics of the silicon film 13*a*.

Figure 19:
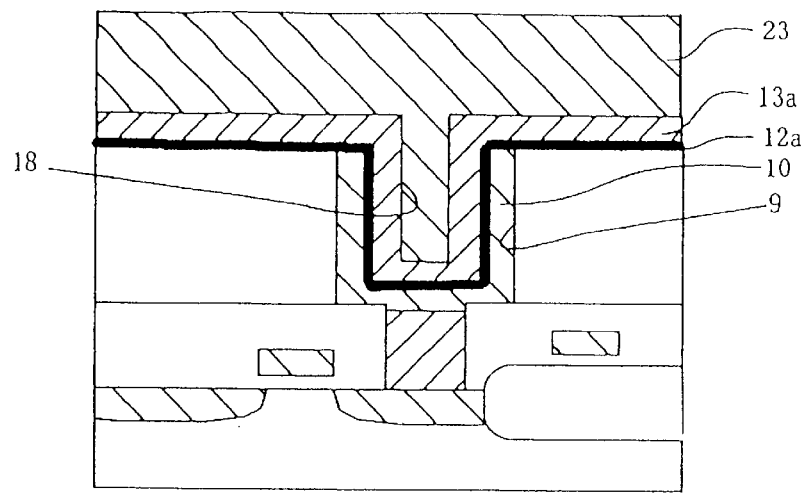
Figure 20:
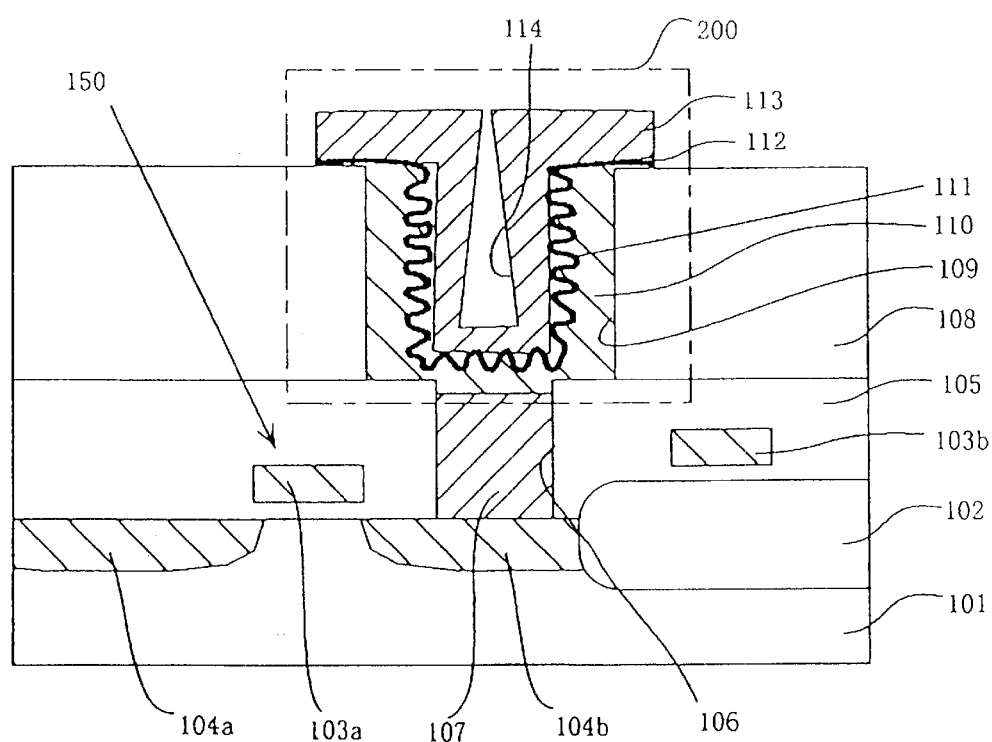
FIG. 20 is a cross-sectional view showing a conventional semiconductor memory device.
Figure 21:
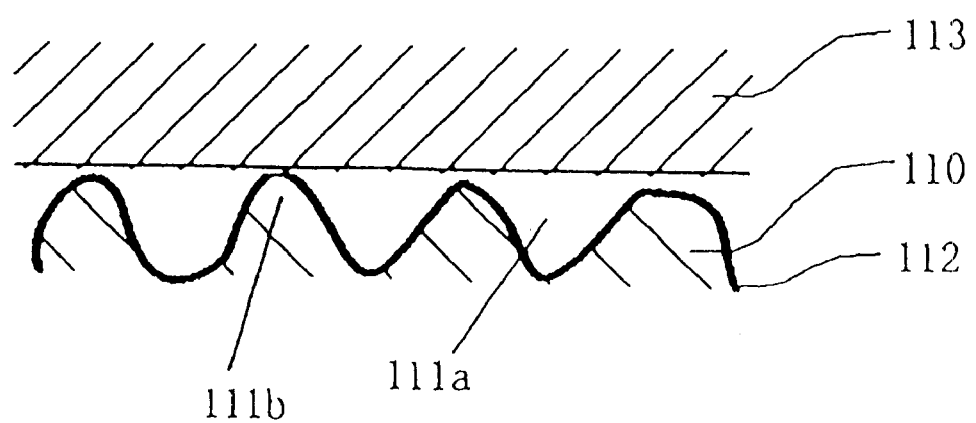
FIG. 21 is a enlarged cross-sectional view for describing problems occurring in the conventional semiconductor memory device.

Next, referring with FIG. 19, the n-type impurities dissolved in the impurity-containing layer 23 are diffused into the silicon film 13*a* by means of the drive-in diffusion technique which uses a tube-type diffusion furnace.

At this time, as a result of diffusion of n-type impurities from the impurity-containing layer 23 embedded in the cylindrical opening 18, n-type impurities are efficiently diffused into the silicon film 13*a* provided within the cylindrical opening 16 of the cylindrical storage node electrode 10.

Consequently, the silicon film 13*b*, in which n-type impurities are implanted to a uniform concentration, can be formed over the entire surface of the silicon film 13*a*.

N-type impurities can be more efficiently diffused into the silicon film 13*a*, if the drive-in diffusion using the tube-type diffusion furnace is performed while the atmosphere in a reaction chamber is controlled at the atmospheric pressure or more.

Next, the impurity-containing layer 23, which is sintered to form a glassy substance through drive-in diffusion, is removed by wet etching (not shown).

Finally, the semiconductor memory device is completed through the manufacturing processes shown in FIGS. 10 through 12, which are similar to those according to the first embodiment.

In the fourth embodiment, the impurity-containing layer 23 is formed by spin-coating a solution in which n-type impurities are dissolved. Alternatively, an oxide film, which is formed to a thickness on the order of ten nanometers from a phosphorous glass film and through use of a tube-type diffusion furnace, may be used in place of the layer formed by spin-coating.

As mentioned above, according to the fourth embodiment, since the silicon film 13*a*, which acts as a first cell plate electrode film, is formed by means of a method that does not employ any n-type impurities, the silicon film 13*a* has improved coverage characteristics with respect to the cylindrical opening 16 of the cylindrical storage node electrode 10. Further, n-type impurities are implanted into the silicon film 13*a*, as a result of diffusion of impurities from the impurity-containing layer 23 formed on the silicon film 13*a*, whereby the n-type impurities are efficiently implanted into the entire silicon film 13*a* to a uniform concentration.

Consequently, impurities can be implanted into the silicon film through use of the conventional, simple spin-coating method, whereby the electrical characteristics and reliability of a device are further improved.

The major benefits of the present invention described above are summarized as follows:

According to the first aspect of the present invention, the coverage characteristics of a first cell plate electrode film is improved with respect to a cylindrical storage node electrode, and depletion in the cell plate electrode is prevented from arising by virtue of a second cell plate electrode. Thus, the electrical characteristics and reliability of the device is improved.

According to the second aspect of the present invention, the coverage characteristics of the first cell plate electrode film is improved with respect to irregularities formed on the surface of a cylindrical storage node electrode, whereby an increase in the surface area due to irregularities can be effectively reflected in the capacitance of a capacitor.

According to the third aspect of the present invention, since the first cell plate electrode has an appropriate thickness, the coverage characteristics of the same is further improved with respect to a cylindrical storage node electrode.

According to the fourth aspect of the present invention, since the second cell plate electrode has an appropriate thickness, the depletion in the cell plate electrode is unfailingly prevented from arising.

According to the fifth aspect of the present invention, impurities are implanted into the first cell plate electrode film to uniform concentration by using an ion implantation technique.

According to the sixth aspect of the present invention, impurities are efficiently implanted into the first cell plate electrode film to uniform concentration while latter is exposed to a high temperature gas environment containing conductive impurities.

According to the seventh aspect of the present invention, since the formation of the first cell plate electrode and the implantation of the impurities are performed sequentially in an identical processing chamber, impurities are efficiently implanted into the first cell plate electrode film with superior control.

According to the eighth aspect of the present invention, impurities are implanted into the first cell plate electrode film to uniform concentration by utilizing the impurity-containing layer.

According to the ninth aspect of the present invention, impurities are implanted into the first cell plate electrode film to uniform concentration through use of a conventional and simple technique in which a spin coating technique is employed.

According to the tenth aspect of the present invention, impurities are implanted into the first cell plate electrode film to uniform concentration through use of a conventional and simple technique in which an impurity doped oxide film is employed.

According to the eleventh aspect of the present invention, impurities are efficiently implanted into the first cell plate electrode film while the latter is exposed to a pressure not less than atmospheric pressure.

According to the twelfth aspect of the present invention, a first cell plate electrode having good coverage characteristics and a second cell plate electrode which prevents depletion is fabricated, whereby semiconductor device which has good electrical characteristics and reliability is manufactured.

According to the thirteenth aspect of the present invention, a storage node electrode having irregularities on the surface thereof is fabricated as well as a first cell plate electrode which has good coverage characteristics with respect to the irregularities. Thus, the present invention is capable of manufacturing a semiconductor device provided with a capacitor having an enough capacity.

According to the fourteenth aspect of the present invention, appropriate thickness is given to both the first and second cell plate electrodes, thereby enabling manufacture of a semiconductor device having good electrical characteristics and reliability.

Further, the present invention is not limited to these embodiments, but variations and modifications may be made without departing from the scope of the present invention.

The entire disclosure of Japanese Patent Application No. Hei 11-184883 filed on Jun. 30, 1999 including specification, claims, drawings and summary are incorporated herein by reference in its entirety.

What is claimed is:

1. A method of manufacturing a semiconductor device comprising the steps of:
    forming a semiconductor element having an impurity diffusion layer on the primary surface of a semiconductor substrate;
    forming a cylindrical storage node electrode which is electrically connected to the impurity diffusion layer by way of a insulating film formed on the semiconductor element and the semiconductor substrate;
    forming a capacitor insulating film on the cylindrical storage node electrode;
    forming a first cell plate electrode film on the capacitor insulating film;
    implanting conductive impurities into the first cell plate electrode film; and
    forming a second cell plate electrode film having conductive impurities on the first cell plate electrode film.

2. The semiconductor device manufacturing method according to claim 1, further comprising a step of forming minute irregularities on the surface of the cylindrical storage node electrode.

3. The semiconductor device manufacturing method according to claim 1, wherein the thickness of the first cell plate electrode film is formed so as to become equal to or less than half of the shortest diameter of a cylindrical portion of the cylindrical storage node electrode.

4. The semiconductor device manufacturing method according to claim 1, wherein the thickness of the second cell plate electrode film is formed so as to become equal to or more than half of the shortest diameter of a cylindrical portion of the cylindrical storage node electrode.

5. The semiconductor device manufacturing method according to claim 1, wherein the conductive impurities are implanted into the first cell plate electrode by means of ion implantation.

6. The semiconductor device manufacturing method according to claim 1, wherein the conductive impurities are implanted into the first cell plate electrode by exposing the latter to a high temperature gas environment containing conductive impurities.

7. The semiconductor device manufacturing method according to claim 6, wherein the steps of forming a first cell plate electrode film and implanting conductive impurities into the first cell plate electrode film are sequentially carried out within a single processing chamber.

8. The semiconductor device manufacturing method according to claim 1, wherein the conductive impurities are introduced into the first cell plate electrode by diffusion of impurities from an impurity-containing layer which contains conductive impurities and is formed on the first cell plate electrode film.

9. The semiconductor device manufacturing method according to claim 8, wherein the impurity-containing layer is formed by coating a solution into which conductive impurities are dissolved on the first cell plate electrode film through use of the spin-coating technique.

10. The semiconductor device manufacturing method according to claim 8, wherein the impurity-containing layer is made of an oxide film containing conductive impurities.

11. The semiconductor device manufacturing method according to claim 8, wherein the step for diffusing the conductive impurities are performed under a pressure equal to or more than atmospheric pressure.

12. A semiconductor device comprising:
a semiconductor element having an impurity diffusion layer formed on the primary surface of a semiconductor substrate;
a cylindrical storage node electrode which is electrically connected to the impurity diffusion layer by way of an insulating film formed on the semiconductor substrate including the semiconductor element;
a capacitance insulating film provided on the cylindrical storage node electrode;
a first cell plate electrode, having a first impurity concentration, provided on the capacitance insulating film; and
a second cell plate electrode, having a second impurity concentration, provided on the first cell plate electrode.

13. The semiconductor device according to claim 12, further comprising minute irregularities provided on the surface of the cylindrical storage node electrode.

14. The semiconductor device according to claim 12, wherein:
the thickness of the first cell electrode is set to equal to or less than half of the shortest diameter of a cylindrical portion of the cylindrical storage node electrode; and
the thickness of the second cell electrode is set to equal to or more than half of the shortest diameter of the cylindrical portion of the cylindrical storage node electrode.

15. The semiconductor device according to claim 12, wherein:
the thickness of the first cell electrode is set to equal to or less than half of the shortest diameter of a cylindrical portion of the cylindrical storage node electrode.

16. The semiconductor device according to claim 12, wherein:
the thickness of the second cell electrode is set to equal to or more than half of the shortest diameter of the cylindrical portion of the cylindrical storage node electrode.

17. The semiconductor device according to claim 12, wherein:
said first impurity concentration is different from said second impurity concentration.

18. The semiconductor device according to claim 12, wherein:
said first impurity concentration is smaller than said second impurity concentration.

19. The semiconductor device according to claim 18, wherein said first impurity concentration is $2 \times 10^{20}$ atoms/cm$^3$ and said second impurity concentration is in the range of $4 \times 10^{20}$ atoms/cm$^3$ to $8 \times 10^{20}$ atoms/cm$^3$, inclusive.

* * * * *